United States Patent
Sillard et al.

(10) Patent No.: US 6,411,763 B1
(45) Date of Patent: *Jun. 25, 2002

(54) INTEGRATED OPTICAL COMPONENT

(75) Inventors: Helene Sillard, Paris; Francois Brillouet, Clamart; Pierre Doussiere, Paris, all of (FR)

(73) Assignee: Alcatel, Paris (FR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/401,295

(22) Filed: Sep. 23, 1999

(30) Foreign Application Priority Data

Sep. 24, 1998 (FR) .............................. 9811964

(51) Int. Cl.$^7$ ................................. G02B 6/10
(52) U.S. Cl. ......................... 385/129; 372/43; 372/50
(58) Field of Search ................................. 385/129–132; 372/43–50

(56) References Cited

U.S. PATENT DOCUMENTS 5,978,400 A * 11/1999 Campbell et al. ............ 372/46
6,091,755 A * 7/2000 Sanders et al. ............... 372/92
6,108,481 A * 8/2000 Tohyama et al. ............ 385/131
RE37,354 E * 9/2001 Welch et al. ................. 372/50

OTHER PUBLICATIONS

M. Yamaguchi et al, "Requirements for Modulator–Integrated DFB LD's for Penalty–Free 2.5 GB/S Transmission" Journal of Lightwave Technology, vol. 13, No. 10, Oct. 1, 1995, pp. 1948–1954, XP000596072.

S. O'Brien et al, "Operating Characteristics of a High –Power Monolithically Integrated Flared Amplifier Master Oscillator Power Amplifier", IEEE Journal of Quantum Electronics, vol. 29, No. 6, Jun. 1, 1993, pp. 2052–2057, XP000397645.

* cited by examiner

*Primary Examiner*—John D. Lee
*Assistant Examiner*—Sarah U Song
(74) *Attorney, Agent, or Firm*—Sughrue Mion, PLLC

(57) ABSTRACT

An integrated optical component having a first section (S1) including a wave guide (10) perpendicular to an output facet (P) of the component, a termination (T) of the wave guide being coupled to this facet, and including a second section (S2) upstream from the first section and capable of being interfered with by the signal reflected by the said facet and guided by the wave guide. The guide termination (T) includes an inclined guiding section (13) and a laterally non-guiding section (14) leading to this facet (P).

4 Claims, 3 Drawing Sheets

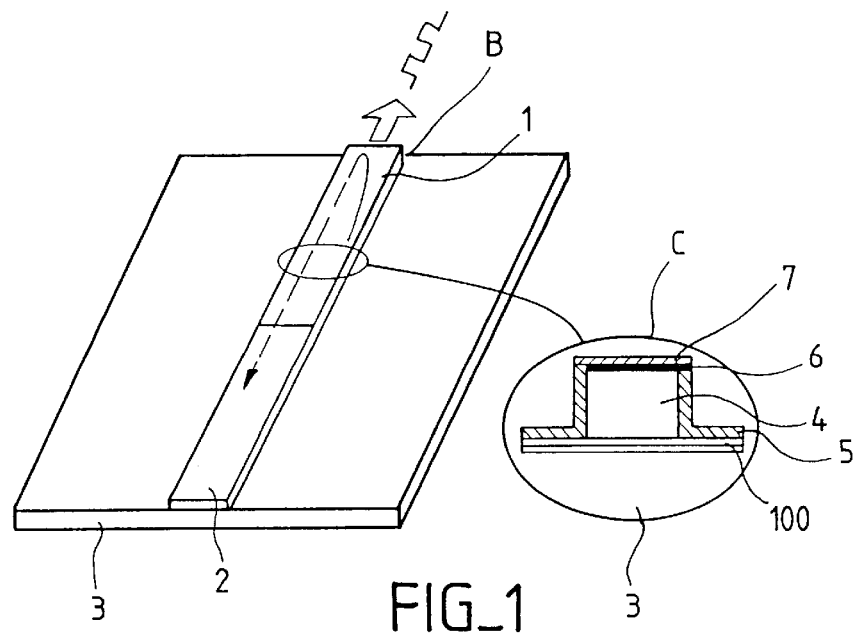
FIG_1
PRIOR ART
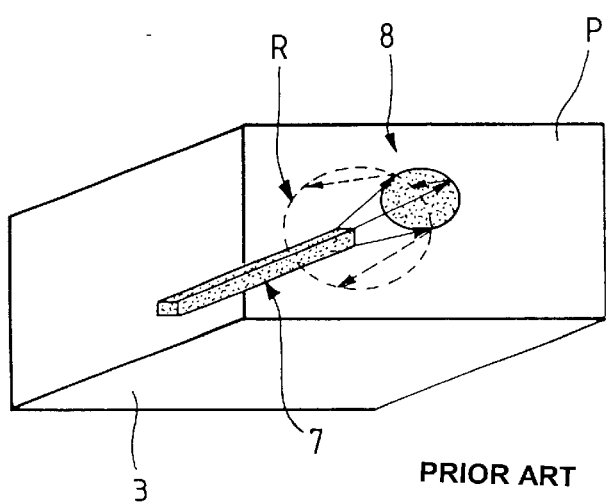
PRIOR ART
FIG_2A
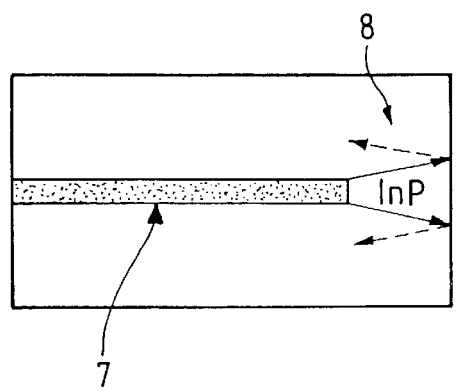
PRIOR ART
FIG_2B

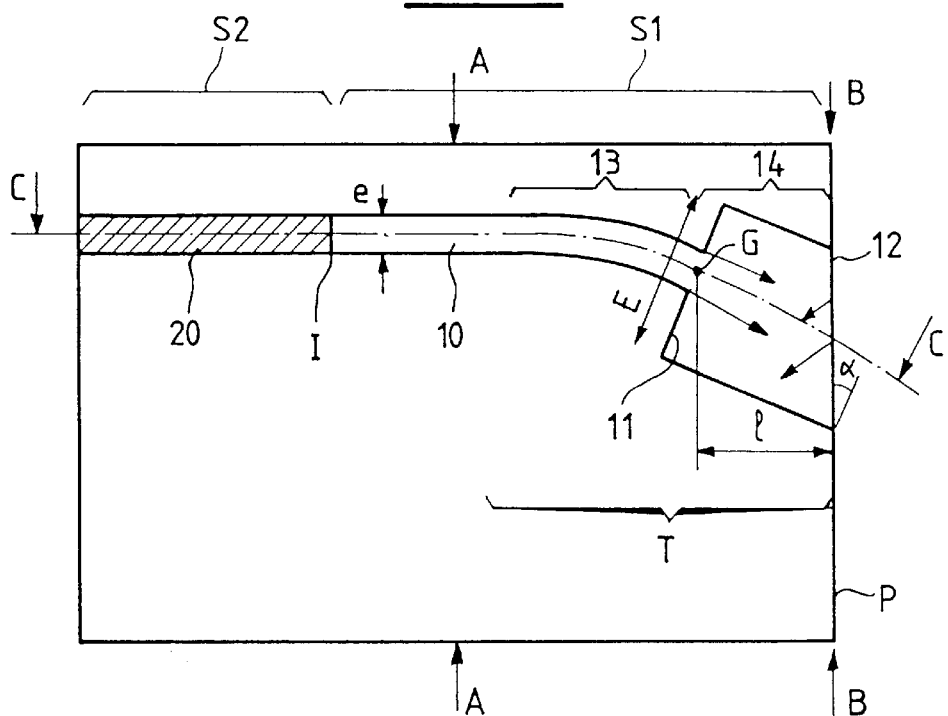
FIG_3
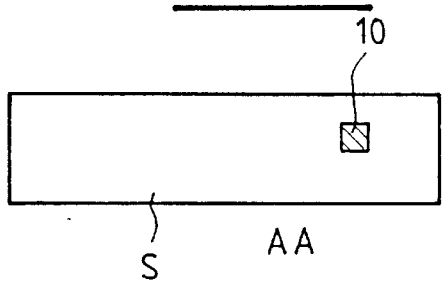
FIG_4A
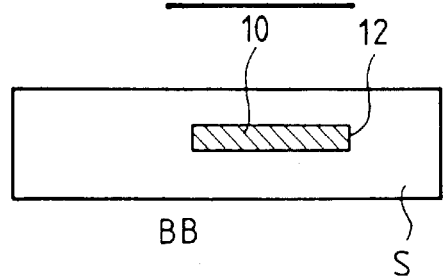
FIG_4B
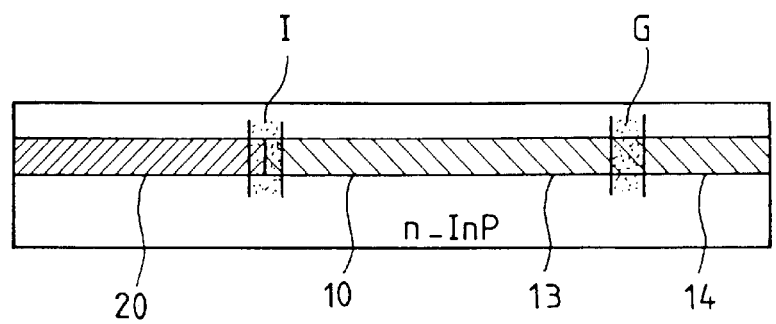
FIG_4C

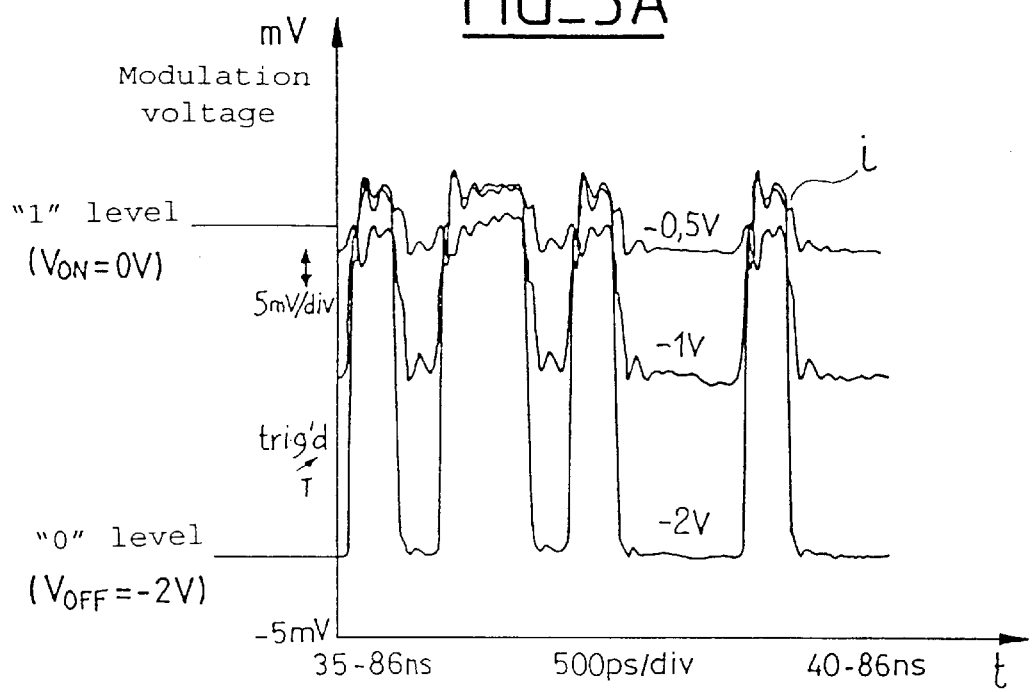
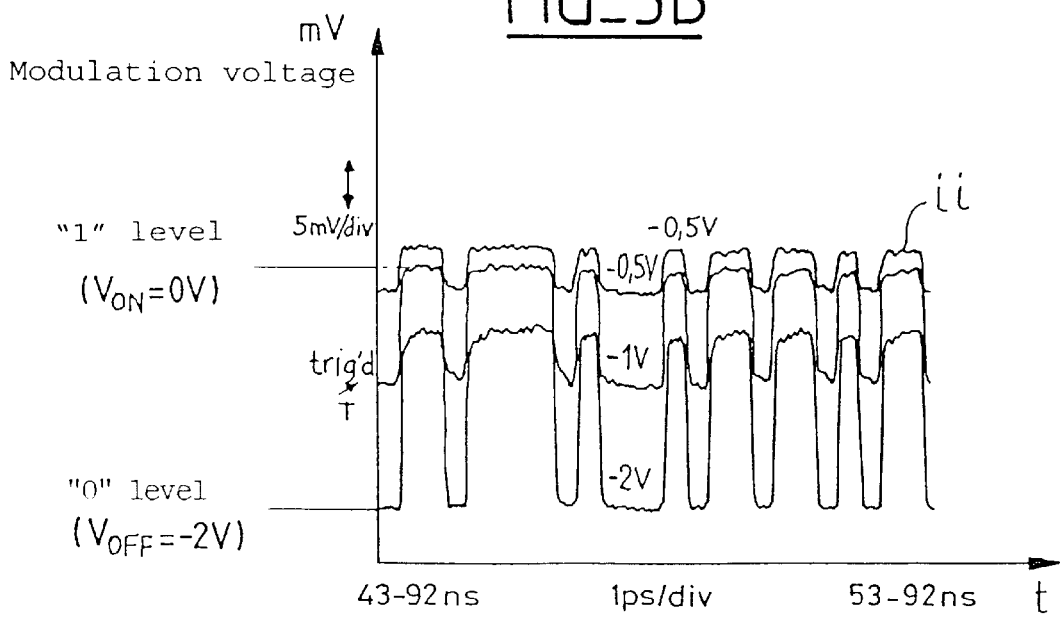

INTEGRATED OPTICAL COMPONENT

The invention relates to an integrated optical component, and more particularly a component having a first section comprising a wave guide perpendicular to an output facet of the component, a termination of the wave guide being coupled to this facet, and comprising a second section upstream from the first capable of being interfered with by the signal reflected by the said facet and guided by the wave guide.

The invention relates notably to laser/modulator components and advantageously applies to electro-absorption integrated optical laser/modulators and to the Mach-Zehnder laser/modulator.

An electro-absorption laser/modulator is taken subsequently for illustrating the prior art and defining the technical problem encountered as well as for defining the invention. Such components are used in applications such as long-distance optical signal transmissions.

Thus, the invention applies to any integrated optical component having a structure having the drawbacks cited above. It therefore applies in particular to laser/modulators, whatever the laser and whatever the modulator, insofar as modulation speeds ranging from 2.5 Gb/s to 10 Gb/s and more are used.

FIG. 1 depicts a diagram illustrating an integrated electro-absorption laser/modulator. This component includes a modulator section 1, preceded by a laser section 2.

The modulator section 1 is shown in detail in the sectional drawing C. There can thus be distinguished an n-doped indium phosphide InP substrate surmounted by a wave guide active layer 1 of quaternary material InGaAsP. A p-doped InP cavity 4 rests on the layer 1 and is delimited by a dielectric layer 5. Above the cavity rests a layer of a quaternary material such as InGaAsP. Above this layer is disposed an electrical contact layer 9.

The modulator section therefore comprises a wave guide 100 perpendicular to the output facet P of the component (cleaved face).

As has been said, the problem encountered with such components comes from the fact that there are reflections of part of the optical signal, on the output facet of the component, and that the reflected signal, which goes back into the guide, can interfere with the upstream sections. This is because the signal emitted by the laser and modulated by the modulator section is partly reflected by this output facet and excites the laser at its resonant frequency. The consequence is that the output signal of the component has a high level of interference and this leads to a degradation of the transmission performance.

A known solution making it possible to reduce the amount of optical power reflected consists in depositing an antireflection coating on the output facet of the component. A reflexivity of −30 to −40 dB is thus typically obtained, which is insufficient for the majority of applications. It is necessary, in particular for laser/modulators, to have −60 dB of reflectivity in order to avoid any excitation of the laser with this signal which is at the resonant frequency of the laser.

Another known solution illustrated by FIGS. 2A and 2B consists in adding a window 8 of indium phosphide InP at the end of the wave guide 7 buried in a substrate 3. To this end, the active cavity, i.e. the guiding layer, is interrupted before the output facet P. The light is then diffracted in this guidance interruption zone precisely as a result of the low guidance exhibited by the window thus implemented. A small amount R of signal is reflected and can return into the guide and reach the laser as can be seen in FIGS. 2A and 2B.

It should be noted on this subject that the integrated optical component fabrication methods call upon the various epitaxy techniques in order to grow layers on an InP substrate. Among these techniques can be cited the so-called MOVPE (Metal Organic Vapour Phase Epitaxy) and MBE (Molecular Beam Epitaxy) techniques.

It turns out that, whatever the epitaxy technique used, the creation of an InP window, as depicted in FIGS. 2A and 2B, at the end of the modulator wave guide, requires an additional lithography step (etching) before the final InP growth.

The implementation of an InP window at the end of the modulator wave guide therefore imposes additional steps which are an etching, and then the growth of the InP in the window.

Besides this first drawback noted with this technique, another exists as a result of the modulator/window interface. This is because this interface can create power losses or interference on the signal.

There is another solution used in a slightly different field to that of laser/modulators, which is that of semiconductor optical amplifiers. In effect, in order to avoid part of the guided and reflected signal being reintroduced into the guide in the case of semiconductor optical amplifiers, the solution consists in creating an angle between the wave guide and the output facet. Thus, the light is reflected at this angle and is consequently less guided.

However, such a solution is not sufficient for strongly guiding structures, as is the case in the integrated optical components comprising a laser/modulator, since the light remains confined in the guide despite the angle of inclination.

The object of the invention is more particularly an integrated optical component having a first section comprising a wave guide perpendicular to an output facet of the component, a termination of the wave guide being coupled to this facet, and comprising a second section upstream from the first capable of being interfered with by the signal reflected by the said facet and guided by the wave guide, principally characterised in that the said guide termination comprises an inclined guiding section and a laterally non-guiding section leading to this facet.

Thus, the wave guide is extended by an inclined guiding section followed by a laterally non-guiding section leading to the output facet of the component.

Advantageously, the inclined guiding section is of curved form.

According to another characteristic, the component has an isolation zone in order to remove the parasitic capacity effects exhibited by the laterally non-guiding section.

According to one application of the invention, the first section is a modulator section and the second section upstream of the first is a laser section, the said component having a laser/modulator function.

Other characteristics and advantages of the present invention will emerge from a reading of the description which is produced below and which is given by way of a non-limitative example and with reference to the drawings in which:

FIG. 1 depicts the diagram of an electro-absorption integrated laser/modulator according to the prior art, FIGS. 2A and 2B depict the perspective and cross-sectional view diagram of an integrated optical section comprising a wave guide with an InP window according to the prior art, FIG. 3 depicts the top view diagram of an integrated optical component according to the invention, this component being a laser/modulator, FIGS. 4A, 4B and 4C depict respectively sectional views along A—A, B—B and C—C according to FIG. 3, FIGS. 5A and 5B depict respectively the curves i and ii of the laser resonance signal.

In the example given and which is illustrated by the diagrams of FIGS. 3, and 4A to 4C, the first section S1 of the component comprises the wave guide 10 of a laser/modulator, while the second section S2, upstream, comprises the laser 20.

The wave guide 10 made of quaternary material such as InGaAsP has conventionally an H+ doped interface I with the laser 20 and an output 12 in the plane of the output facet P of the component (cleavage plane).

The wave guide 10 has a termination T comprising an inclined section 13 terminating in a section 14 which is laterally non-guiding for the signal originating from the narrow section 13 of the guide.

The non-guiding section 14 has, for this, a width E (for example 40 μm) greater than the width e of the narrow section of the guide (which is for example 3.5 μm). The distance l between the output G of the narrow section 13 of the guide and the output facet P of the component is around 30 μm. This distance can be reduced to 15 μm.

In order to remove the parasitic capacity effects exhibited by the laterally non-guiding section 14, the guide has preferably an isolation zone around the narrow output G, as can be seen in FIG. 4C. In practice, this isolation zone is obtained by H+ proton implantation.

The component can be implemented conventionally by any known epitaxy technique since a mask of suitable form (an angle of inclination with respect to the output facet and widening) is used for the etching of the active layer forming the guide which can be seen in FIG. 3.

The widening of the termination of the guide is therefore obtained without interruption of the active layer 10 (the guiding layer), but simply by using a fabrication mask modified with respect to the masks commonly used. In fact the mask used for etching the active layer will have for example the form which can be seen in FIG. 3.

Other variants as regards the form can be envisaged since they make it possible to remove the lateral guidance of the optical signal. In the example of FIG. 3, the widened edge 11 of the active layer has an angle of 180° with the lateral edges of the section 13. This edge 11 could for example have an angle greater than 180°.

Another variant can consist in taking an infinite width E, i.e., in practice, the edge 11 of width E reaches the two lateral edges of the component (the edges perpendicular to the facet P).

As regards the inclined section of the guide, an inclination having an angle α with the output facet, of around 10°, has been chosen.

Practically, the inclination comes in the form of a curve.

The combination of the effects of the presence of a laterally non-guided section and a section inclined with respect to the output facet makes it possible to divert the part of the signal reflected by this facet and to diffract it.

The amount of signal reflected and sent back into the narrower guided part is greatly reduced compared with the prior art.

These results are illustrated by the curves i and ii of FIGS. 5A and 5B. The curves are given by way of example for a high level "1" modulation voltage $V_{ON}$ =0V, and a low level "0" voltage $V_{OFF}$ =−2V and −1V.

The curves i illustrate the oscillation at the resonant frequency of the laser caused by the return reflected signal for a component having a rectilinear structure such as that depicted in FIGS. 2A and 2B.

The curves ii illustrate the signal at the resonant frequency of the laser with a component having a structure in accordance with the present invention. This figure shows that there is no oscillation.

What is claimed is:

1. An integrated optical component having a first section (S1) comprising an active layer forming a wave guide (1) perpendicular to an output facet (P) of the component, a termination (T) of the wave guide being coupled to this facet, and comprising a second section (S2) upstream from the first section and capable of being interfered with by the signal reflected by said facet and guided by the wave guide, wherein said guide termination (T) comprises an inclined guiding section (13) and a laterally non-guiding section (14) leading to this facet without interruption of said active layer up to said facet.

2. An integrated optical component according to claim 1, wherein the inclined guiding section (13) is of curved form.

3. An integrated optical component according to claim 1 or 2, further comprising an isolation zone (G) to remove the parasitic capacity effects exhibited by the laterally non-guiding section (14).

4. An integrated optical component according to claim 1, wherein the first section (S1) is a modulator section and the second section (S2) upstream from the first section is a laser section, and wherein the component has a laser/modulator function.

* * * * *